United States Patent
Sun et al.

(10) Patent No.: US 9,112,090 B2
(45) Date of Patent: Aug. 18, 2015

(54) UV RADIATION RECOVERY OF IMAGE SENSOR

(75) Inventors: Chung-Ren Sun, Kaohsiung (TW); Shiu-Ko JangJian, Tainan (TW); Chun-Jung Chang, Tainan (TW); Tong-Her Sher, Shuishang Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 423 days.

(21) Appl. No.: 13/476,717

(22) Filed: May 21, 2012

(65) Prior Publication Data

US 2013/0193541 A1 Aug. 1, 2013

Related U.S. Application Data (60) Provisional application No. 61/592,955, filed on Jan. 31, 2012.

(51) Int. Cl.
*H01L 31/0232* (2014.01)
*H01L 31/18* (2006.01)
(Continued)

(52) U.S. Cl.
CPC ........ *H01L 31/103* (2013.01); *H01L 21/76814* (2013.01); *H01L 21/76825* (2013.01); *H01L 27/1464* (2013.01); *H01L 27/14636* (2013.01); *H01L 27/14643* (2013.01); *H01L 27/14645* (2013.01); *H01L 27/14698* (2013.01); *H01L 31/1804* (2013.01); *H01L 27/14621* (2013.01); *H01L 27/14627* (2013.01); *Y02E 10/547* (2013.01)

(58) Field of Classification Search
CPC .................. H01L 27/14636; H01L 27/14687; H01L 27/14698; H01L 21/76825; H01L 21/76814; H01L 27/1464; H01L 27/14643; H01L 27/14645
USPC ...................... 257/E31.11, E31.113
See application file for complete search history.

(56) References Cited

U.S. PATENT DOCUMENTS 6,319,809 B1 * 11/2001 Chang et al. .................. 438/597
8,454,750 B1 * 6/2013 Shrinivasan et al. .......... 118/719
(Continued)

FOREIGN PATENT DOCUMENTS

| JP | 2002-203968 | 7/2002 |
| KR | 1020090054239 | 5/2009 |
| WO | 2010056772 A1 | 5/2010 |

OTHER PUBLICATIONS

Korean Office Action and English Translation, Patent Application No. 10-2012-0083728, Aug. 28, 2013, 8 pages.
(Continued)

*Primary Examiner* — Marvin Payen
*Assistant Examiner* — Jeremy Joy
(74) *Attorney, Agent, or Firm* — Slater & Matsil, L.L.P.

(57) ABSTRACT

A method of an embodiment comprises forming a dielectric layer on a first side of an image sensor substrate, and exposing the dielectric layer to ultraviolet (UV) radiation. The image sensor substrate comprises a photo diode. A structure of an embodiment comprises a substrate and a charge-less dielectric. The substrate comprises a photo diode. The charge-less dielectric layer is on a first side of the substrate, and a total charge of the charge-less dielectric results in an average voltage drop of less than 0.2 V across the charge-less dielectric layer.

19 Claims, 7 Drawing Sheets

(51) Int. Cl.
*H01L 31/103* (2006.01)
*H01L 27/146* (2006.01)
*H01L 21/768* (2006.01)

(56) References Cited

U.S. PATENT DOCUMENTS

| | | |
|---|---|---|
| 2007/0161230 A1 | 7/2007 | Chen et al. |
| 2009/0130792 A1 | 5/2009 | Lee et al. |
| 2009/0137111 A1* | 5/2009 | Lee et al. ................ 438/618 |
| 2010/0227427 A1 | 9/2010 | Kanbe et al. |
| 2011/0111533 A1 | 5/2011 | Varadarajan et al. |
| 2011/0260221 A1* | 10/2011 | Mao et al. ................ 257/291 |
| 2011/0312191 A1 | 12/2011 | Ohkura et al. |
| 2013/0149807 A1* | 6/2013 | Jangjian et al. ............. 438/70 |
| 2013/0153901 A1* | 6/2013 | Jangjian et al. ............. 257/49 |

OTHER PUBLICATIONS

Ho, P., "Charge Motion on Silicon Oxide Surfaces," Surface Science 6, 1967, pp. 440-460, North-Holland Publishing Co., Amsterdam.

* cited by examiner

UV RADIATION RECOVERY OF IMAGE SENSOR

This application claims the benefit of U.S. Provisional Application No. 61/592,955, filed on Jan. 31, 2012, entitled "Dark Current Reduction by Dielectric UV Light Recovery of CMOS Image Sensor," which application is hereby incorporated herein by reference in its entirety.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption, and higher noise immunity. In addition, CMOS image sensors may be fabricated on the same high volume wafer processing lines as logic and memory devices. As a result, a CMOS image chip may comprise both image sensors and all the necessary logic such as amplifiers, A/D converters and the like.

CMOS image sensors are typically pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a back side. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. In a BSI image sensor, light is incident on the back side of the CMOS image sensor. As a result, light can strike the photo diode through a direct path.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely a front side illuminated image sensor and back side illuminated image sensor. Other embodiments may be applied to other various configurations of image sensors. Methods for forming the image sensors are disclosed, and although the methods are described in a particular order, method embodiments may be performed in any logical order.

Figure 1:
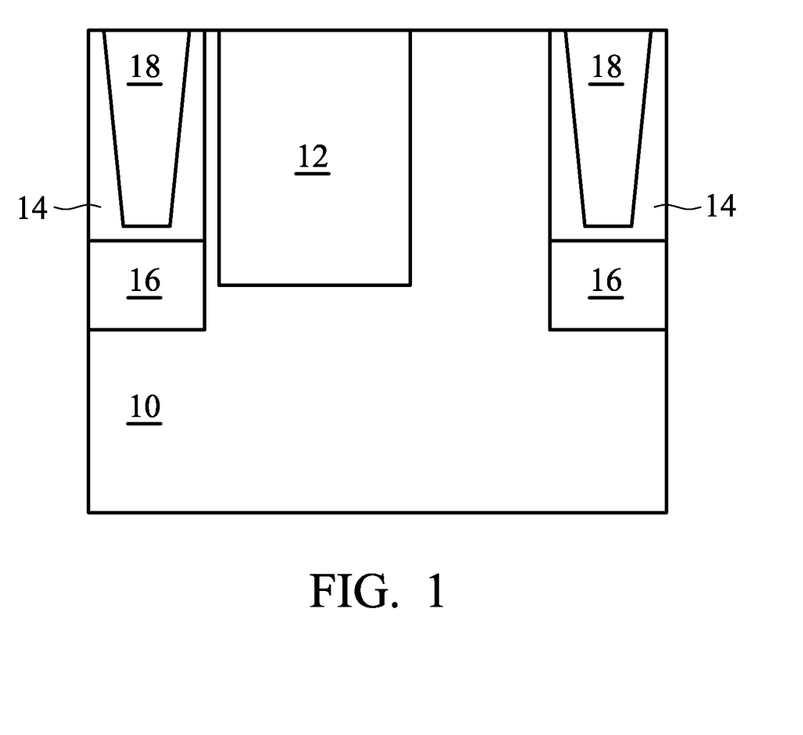
FIG. 1 is a cross sectional view of an image sensor substrate in accordance with an embodiment.

FIG. 1 illustrates a cross sectional view of an image sensor substrate 10 in accordance with an embodiment. In an image sensor array, there may be a plurality of pixels, each of which may include a photo diode formed in a semiconductor substrate, such as silicon. In an embodiment, the substrate 10 may include a p-type epitaxial layer grown from a p-type bulk substrate. For simplicity, one pixel is illustrated to clearly show details of various embodiments.

As shown in FIG. 1, the pixel includes a photo diode 12 formed by a p-type doped region and an n-type doped region. The p-type doped region may be formed by using an ion implantation process from a front side of the wafer. The p-type doped region is doped with p-type doping materials, such as boron. The n-type doped region may be formed by using an ion implantation process from a front side of the wafer. The n-type doped region is doped with n-type doping materials, such as phosphorus.

Cell p-well (CPW) regions 14 are formed on opposite sides of the photo diode 12, and deep p-well (DPW) regions 16 are formed under respective CPW regions 14. The CPW regions 14 and DPW regions 16 are formed of p-type doping materials, such as boron and the like. The CPW regions 14 have a doping concentration that is typically greater than a doping concentration of the DPW region 16.

The isolation regions 18 are formed in respective CPW regions 14, for example, by etching a trench and filling the trench with a dielectric material, such as an oxide using a high density plasma chemical vapor deposition (HDP-CVD), to form a shallow trench isolation (STI). It should be noted that FIG. 1 is merely an example of an image sensor substrate 10, and other embodiments contemplate various other configurations, which can include further components, like components for a transistor in conjunction with the photo diode 12.

Figure 2:
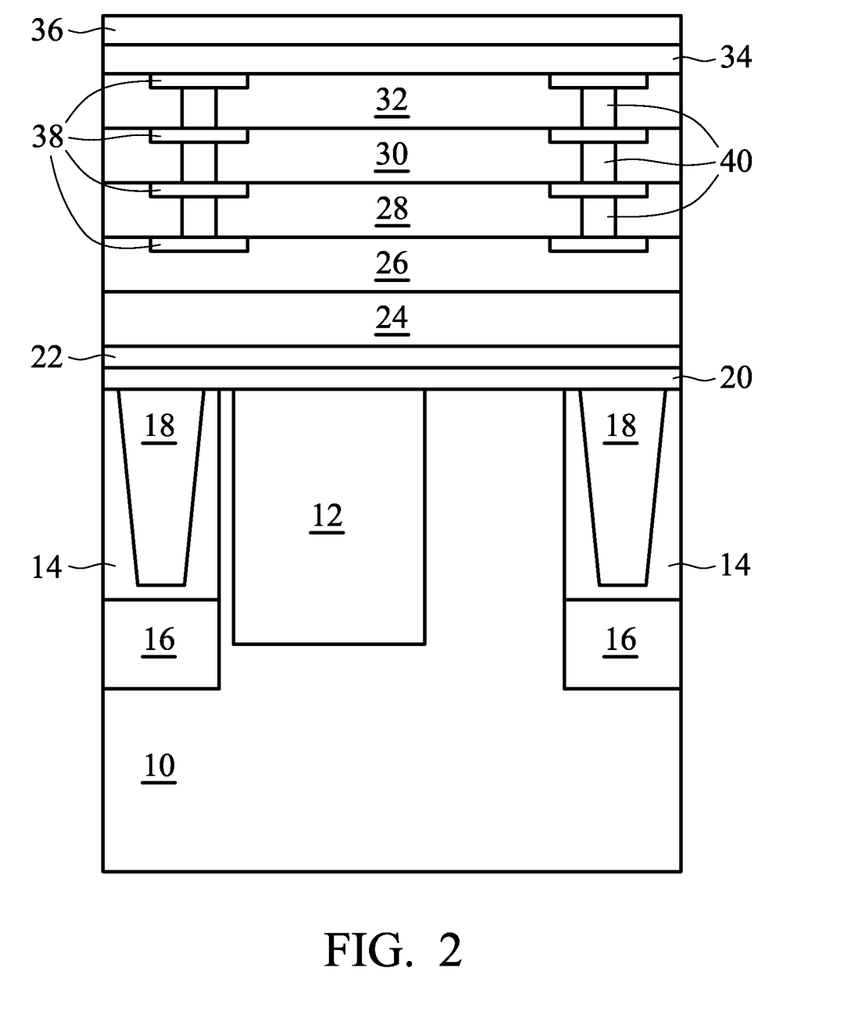
FIG. 2 is the image sensor substrate having various dielectric layers and metallization patterns formed thereover according to an embodiment.

FIG. 2 illustrates the image sensor substrate 10 having various dielectric layers and metallization patterns formed thereover. A resist protective layer (RPL) 20 is formed over the substrate 10. The RPL 20 can be an oxide deposited by chemical vapor deposition (CVD) or the like. Other materials formed by acceptable processes can be used for the RPL 20. An etch stop layer (ESL) 22 is formed over the RPL 20. The ESL 22 can be a nitride deposited by CVD or the like, although other materials can be used for the ESL 22 formed by acceptable processes.

An inter-layer dielectric (ILD) 24 is formed over the ESL 22. The ILD 24 can be silicon oxide, borophosphosilicate glass (BPSG), the like, or a combination thereof, formed by CVD, HDP-CVD, furnace deposition, the like, or a combination thereof. Contacts can be formed through the ILD 24, the ESL 22, and the RPL 20 using acceptable photolithography techniques. For example, a photoresist can be spun onto the ILD 24, and the photoresist can be patterned using an exposure to light. An etch process, which may include multiple etch steps and etchants due to possible different materials in the layers, can use the patterned photoresist to etch openings through the ILD 24, ESL 22, and RPL 20 to features in the substrate 10. After removing the photoresist, conductive materials, such as a metal with a barrier layer, can be deposited over the ILD 24 and into the openings using, for example, CVD, ALD, the like, or a combination thereof. A polishing and/or grinding process, such as a CMP, can remove excess conductive materials and leave the contacts in the openings.

Subsequent inter-metal dielectrics (IMDs) 26, 28, 30, and 32 having metallization patterns 38 and vias 40 are formed over the ILD 24. Each of the IMDs 26, 28, 30, and 32 can be silicon oxide, BPSG, the like, or a combination thereof, formed by CVD, HDP-CVD, furnace deposition, the like, or a combination thereof. The vias 40 and metallization patterns 38 in each of the IMDs 26, 28, 30, and 32 can be formed using, for example, a damascene process. In an example damascene process, for example, a photoresist can be spun onto the IMD, and the photoresist can be patterned using an exposure to light. An etch process can use the patterned photoresist to etch partially through the IMD to form the beginning of a via opening. After removing the photoresist, another photoresist can be spun onto the IMD and patterned. An etch process can use the patterned photoresist to etch the via opening through the IMD, for example to an underlying conductive feature, and can etch a recess for the metallization pattern in the IMD. Conductive materials, such as a metal with a barrier layer, can be deposited over the IMD and into the via opening and metallization recess using, for example, CVD, ALD, the like, or a combination thereof. A polishing and/or grinding process, such as a CMP, can remove excess conductive materials and leave the vias 40 and metallization patterns 38 in the via openings and recesses, respectively. The IMDs 26, 28, 30, and 32 are sequentially formed, along with the respective vias 40 and metallization patterns 38.

A first passivation layer 34 is formed over the top IMD 32, and a second passivation layer 36 is formed over the first passivation layer 34. The passivation layers 34 and 36 can be silicon nitride or the like, deposited by CVD or the like. It should be noted that many other components may be included in an embodiment that are not expressly depicted. For example, etch stop layers can be disposed between the various interfaces between layers of the ILD 24 and IMDs 26, 28, 30, and 32. Further, more or fewer IMDs can be used.

In embodiments, at various stages in forming the ILD 24 and IMDs 26, 28, 30, and 32, the structure including the dielectric layers is exposed to ultraviolet (UV) radiation. When the various dielectric layers, contacts, vias, and metallization patterns are formed, charges can accumulate in the dielectric layers. Some of the charges include a fixed charge ($Q_f$), an interface trapped charge ($Q_{it}$), a bulk trapped charge ($Q_{ot}$), a mobile charge ($Q_m$), and a surface charge ($Q_{surf}$). These charges can accumulate, for example, as a result of ion implantation steps, plasma exposure such as during a reactive ion etch (RIE), a photoresist spin-on, and others. If large quantities of these charges remain in a final structure, a pixel of the image sensor can become activated without exposure to light, such as in a totally dark (e.g., 0 lux) environment. To help prevent this occurrence, one or more of the dielectric layers can be exposed to UV radiation to cause the one or more dielectric layers to become electrically more stable.

The charges accumulated on various dielectric layers may come from dangling bonds within the dielectric layers. It is suspected that by exposing the dielectric layers to UV radiation, the UV radiation may influence not only atoms but also electrons. Electrons of dangling bonds that absorb UV radiation can become free electrons. The free electrons may then be in a more stable state by recombination or excitation. On the other hand, the UV radiation can provide energy that can increase the electronic transition energy of atoms, possibly leading the highest-occupied-molecular-orbital or lowest-unoccupied-molecular-orbital to be in a more stable form. This can also lead to a decrease or increase in the number of vacancies in a dielectric.

Embodiments contemplate that a UV radiation exposure is used after the formation of each dielectric layer, only after the formation of all dielectric layers, or a combination of after each of some layers and after forming a few layers without an exposure. Embodiments contemplate that various dielectrics are exposed to a UV radiation at any point during processing. Further, various dielectric layers can be exposed once or multiple times. A UV radiation exposure, according to an embodiment, is a broad spectrum exposure covering a broad range of UV wavelengths. In an embodiment, the UV radiation exposure comprises UV radiation that has a wavelength range from approximately 200 nm to approximately 450 nm, such as approximately 200 nm to approximately 250 nm. In an embodiment, a UV radiation exposure can be from approximately 2 minutes to approximately 2 hours, such as approximately 3 minutes to approximately 5 minutes, and such as 200 seconds. In an embodiment, a pressure in which the UV radiation exposure occurs is between about 2 torr and about 15 torr. In embodiments, a spacing between the substrate and the UV radiation source can be between approximately 200 mils and approximately 1,000 mils, and a gas flow of, for example, argon (Ar) and/or helium (He) within a UV exposure chamber can be between about 2,000 sccm and about 40,000 sccm. Other process parameters can be readily determined by routine experimentation by a person having ordinary skill in the art.

According to an embodiment, a dielectric layer is charge-less after the UV radiation exposure. In an embodiment, the charge-less dielectric layer has a total charge that results in an average voltage drop across the dielectric of less than 0.2 V. In a tested embodiment, before the UV radiation exposure, the dielectric layer had a total charge resulting in an average voltage drop of 3.28 V across the dielectric layer, with a maximum of 3.54 V and a minimum of 2.42 V. After a UV radiation exposure, the dielectric layer had an average voltage drop of 0.156V, with a maximum of 0.189 V and a minimum of 0.116 V. In another embodiment, after the UV radiation exposure, a dielectric layer had an average voltage drop of 0.181 V, with a maximum of 0.467 and a minimum of 0.107 V.

Figure 3:
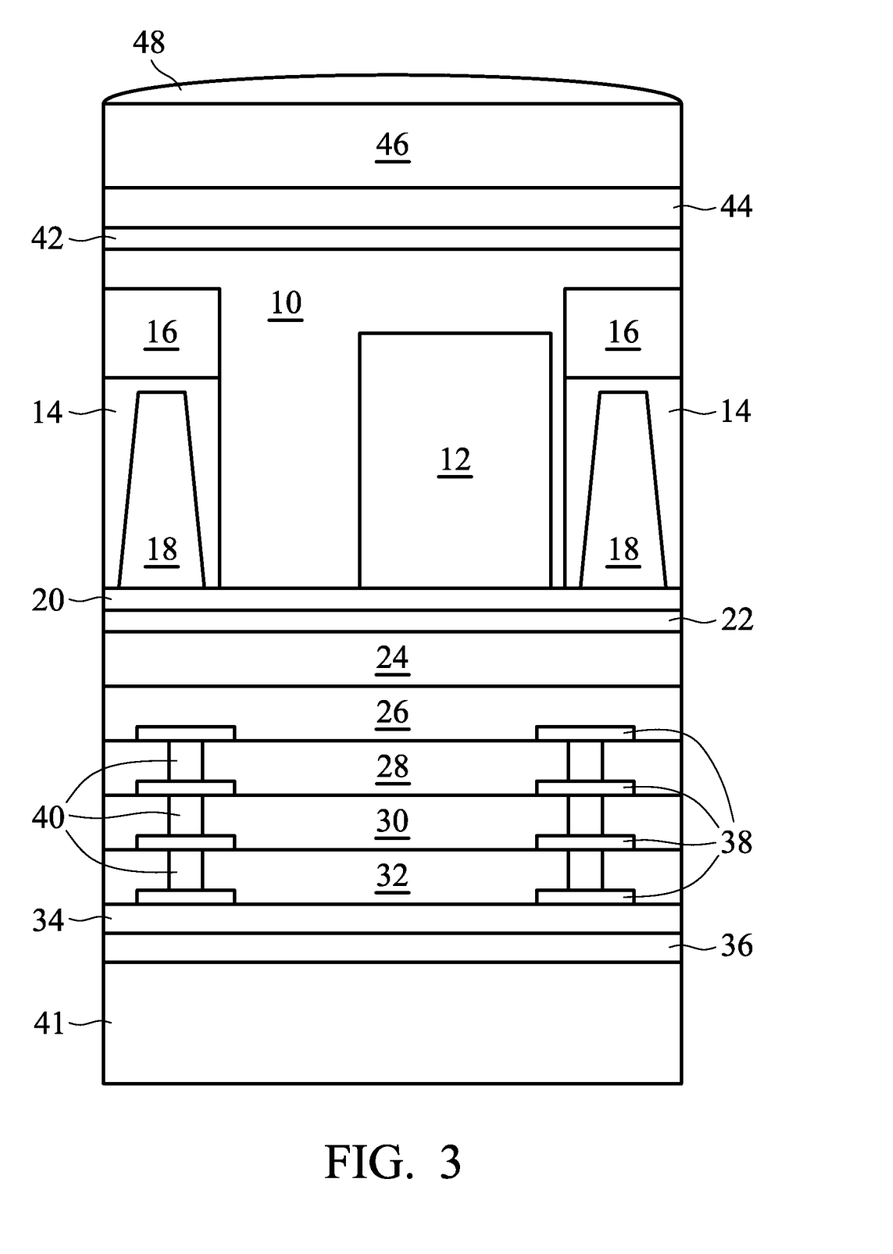
FIG. 3 is a cross sectional view of the image sensor substrate of FIG. 2 in the formation of a back side illuminated image sensor in accordance with an embodiment.

FIG. 3 is a cross sectional view of the image sensor substrate 10 of FIG. 2 after being flipped and bonded on a carrier 41 in accordance with an embodiment. In FIG. 3, the image sensor substrate 10 is used to form a back side illuminated image sensor. Once the IMDs 26, 28, 30, and 32 and passivation layers 34 and 36 are formed in FIG. 2, the image sensor substrate 10 is flipped and bonded on the carrier 41, which can be silicon, glass, or the like. The front side of the image sensor substrate 10 faces toward the carrier 41. Various bonding techniques may be employed to achieve bonding between the image sensor substrate 10 and the carrier 41. In accordance with an embodiment, suitable bonding techniques may include adhesive bonding, vacuum bonding, anodic bonding, or the like. The carrier 41 may provide sufficient mechanical support to resist forces due to a grinding step of a thinning process.

A thinning process is applied to the back side of the image sensor substrate 10. In an embodiment, the substrate is thinned until a highly doped p-type substrate is removed and a lightly doped p-type epitaxial layer is exposed. A thin substrate 10 can allow more light to pass through the substrate 10 and hit the photo diode 12 embedded in the substrate 10 without being absorbed by the substrate 10. The thinning process may be implemented by using suitable techniques such as grinding, polishing, and/or chemical etching.

A thin P+ layer 42 is formed on the back side of the substrate 10. The thin P+layer 42 may be formed on the back side of the thinned substrate to increase the number of photons converted into electrons. A P+ ion implantation process used in forming the P+ layer 42 may cause crystal defects. In order to repair crystal defects and activate the implanted P+ ions, a laser annealing process may be performed on the back side of the image sensor substrate 10.

An anti-reflection coating (ARC) 44 is formed over the P+ layer 42. The ARC 44 can be a silicon nitride or the like, deposited by CVD or the like. A color filter layer 46 is formed over the ARC 44. The color filter layer 46 may be used to allow specific wavelengths of light to pass while reflecting other wavelengths, thereby allowing the image sensor to determine the color of the light being received by the photo diode 12. The color filter layer 46 may vary, such as a red, green, and blue filter. Other combinations, such as cyan, yellow, and magenta, may also be used. The number of different colors of the color filter layer 46 may also vary. The color filter layer 46 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 46. Other materials, however, may be used. The color filter layer 46 may be formed by any suitable method.

A microlens layer 48 is formed over the color filter layer 46. The microlens layer 48 may be formed of any material that may be patterned and formed into lenses, such as a high transmittance, acrylic polymer. In an embodiment, the microlens layer 48 may be formed using a material in a liquid state and spin-on techniques. This method has been found to produce a substantially planar surface and a microlens layer 48 having a substantially uniform thickness, thereby providing greater uniformity in the microlenses. Other methods, such as deposition techniques like CVD, physical vapor deposition (PVD), or the like, may also be used.

Figure 4:
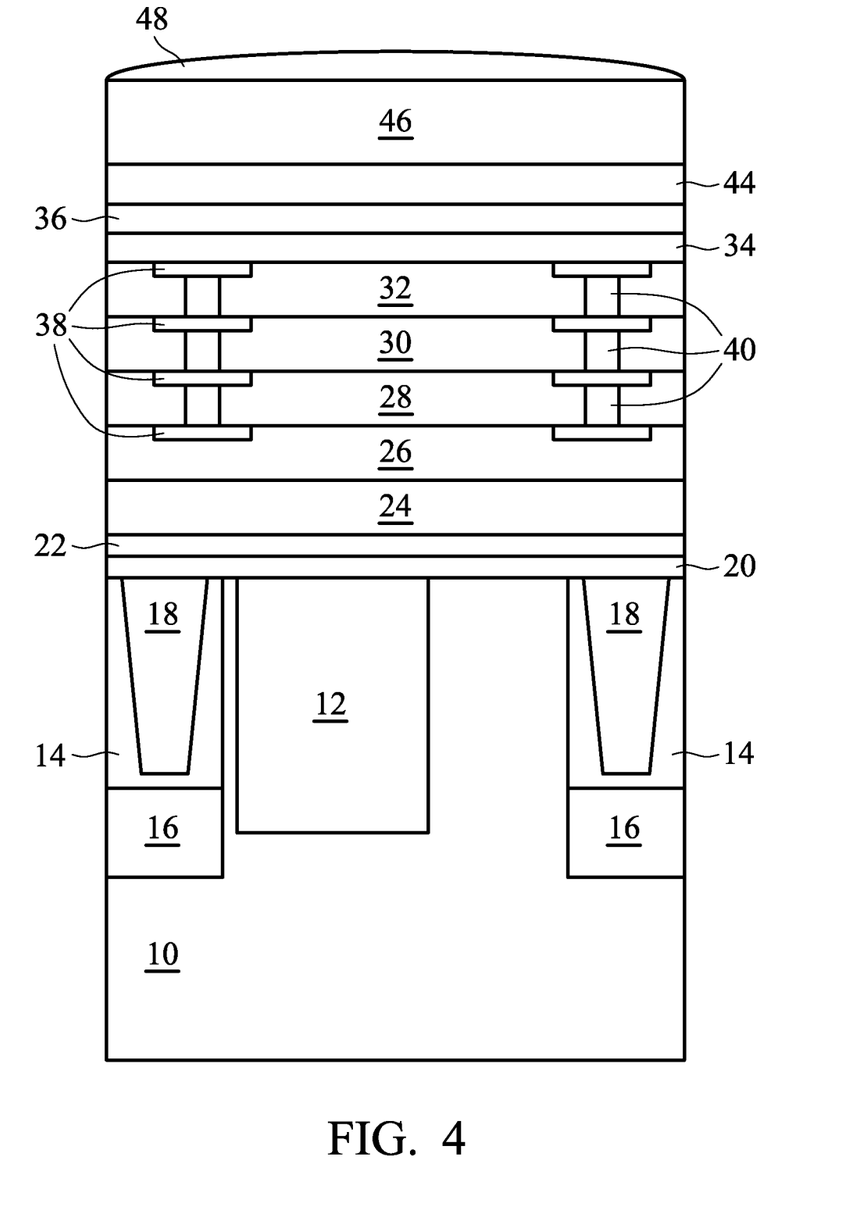
FIG. 4 is a cross sectional view of the image sensor substrate of FIG. 2 to form a front side illuminated image sensor in accordance with an embodiment.

FIG. 4 is a cross sectional view of the image sensor substrate 10 of FIG. 2 with processing continuing on the front side to form a front side illuminated image sensor in accordance with an embodiment. The ARC 44 is formed on the second passivation layer 36. The ARC 44 can be a same or similar material formed by a same or similar process as discussed previously with respect to FIG. 3. A color filter layer 46 is formed over the ARC 44, and a microlens layer 48 is formed over the color filter layer 46. The color filter layer 46 and the microlens layer 48 may be a same or similar material formed by a same or similar process as discussed previously with respect to FIG. 3.

Figure 5:
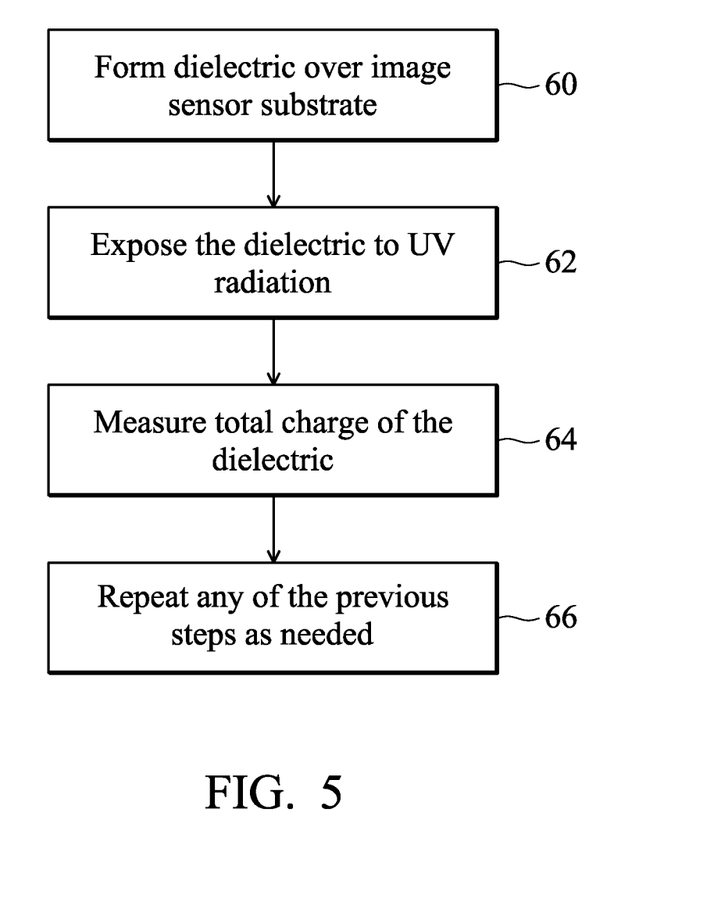
FIG. 5 is a method of forming an image sensor according to an embodiment.

FIG. 5 is a method of forming an image sensor according to an embodiment. In step 60, a dielectric layer is formed over an image sensor substrate. The dielectric layer can be any of the RPL 20, ESL 22, ILD 24, IMDs 26, 28, 30, and 32, and passivation layers 34 and 36, as discussed with respect to FIG. 2. The dielectric layer can have components formed therein, such as contacts, vias, and/or metallization patterns. In step 62, the dielectric layer is exposed to UV radiation, such as discussed with regard to FIG. 2. In step 64, a total charge of the dielectric layer is measured, such as by using a Quantox measurement. In step 66, any of steps 60, 62, and 64 can be repeated as needed. For example, if the measured total charge is not within an adequate range, the dielectric layer can be exposed to UV radiation again in step 62. Further, additional dielectric layers can be formed, and the dielectric layers can be exposed to UV radiation immediately after each respective formation process or collectively after the last formation process.

Figure 6A:
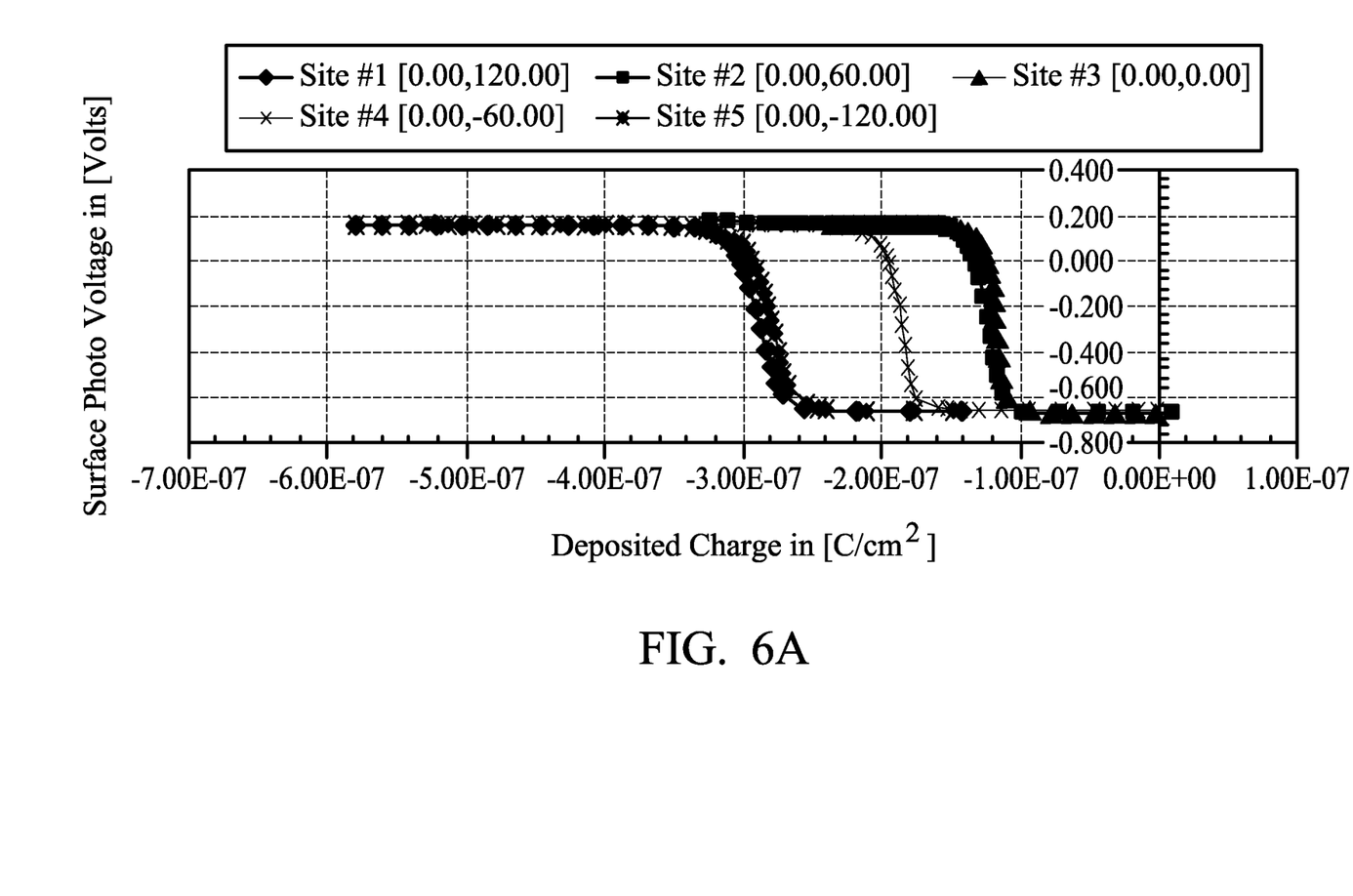
FIGS. 6A and 6B are results of Quantox measurements before and after a UV radiation exposure, respectively, in accordance with an embodiment.
Figure 6B:
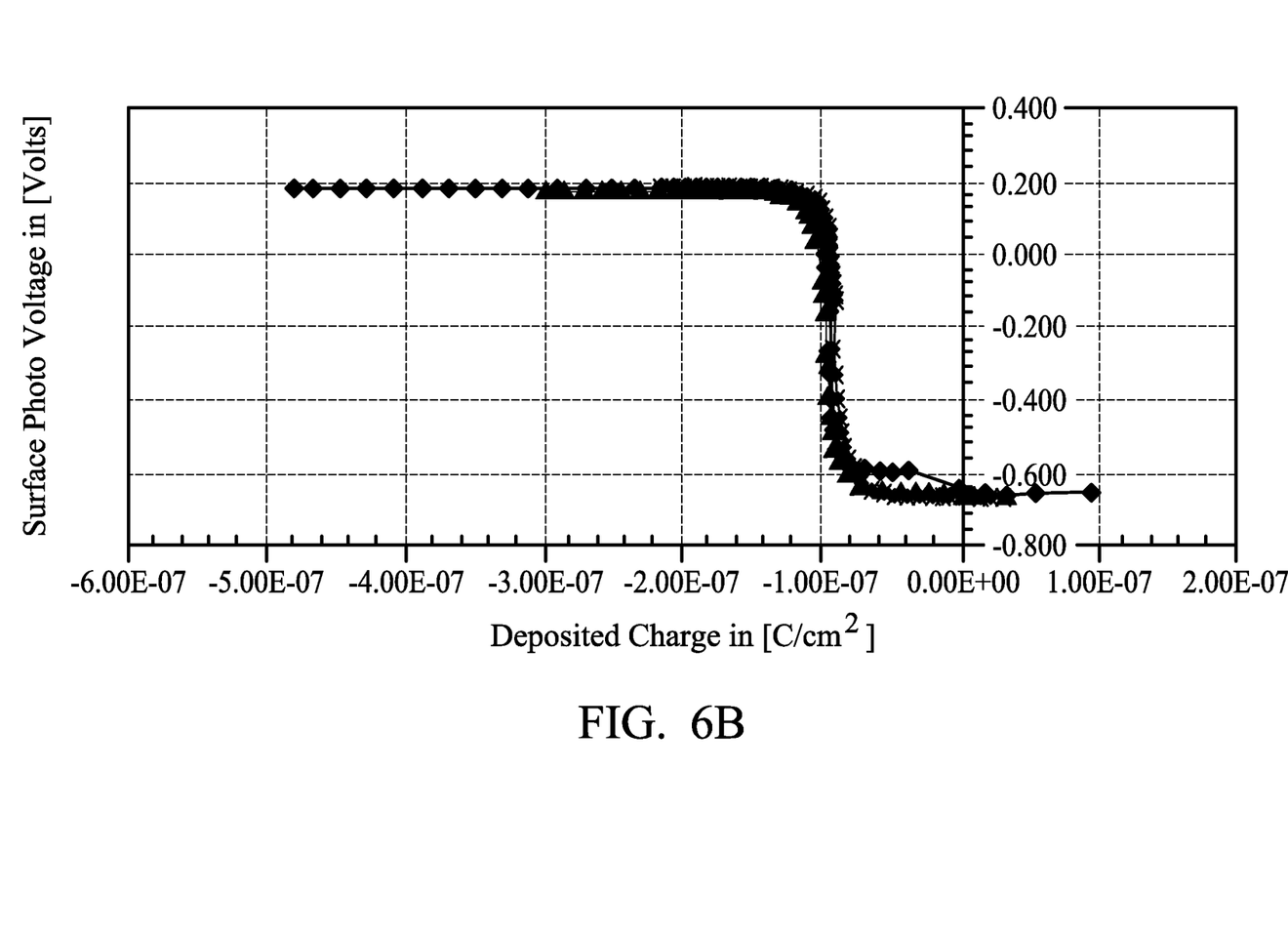

FIGS. 6A and 6B show results of Quantox measurements before and after a UV radiation exposure, respectively. In FIG. 6A, the total charge at five sites on a dielectric layer formed on an image sensor substrate are measured by Quantox. As shown, the different sites have varying amounts of charge deposited on the surface by the Quantox before the UV radiation exposure. In FIG. 6B, the different sites have a more uniform charge deposition and have a lower amount of charge deposited after the UV radiation exposure.

An embodiment is a method. The method comprises forming a dielectric layer on a first side of an image sensor substrate, and exposing the dielectric layer to ultraviolet (UV) radiation. The image sensor substrate comprises a photo diode. No photoresist is over the dielectric layer during the exposing the dielectric layer to the UV radiation.

Another embodiment is a method comprising forming a photo diode in a substrate; depositing a dielectric structure a first side of the substrate; and exposing the dielectric structure to broad spectrum ultraviolet (UV) radiation. The broad spectrum UV radiation has UV radiation with a plurality of wavelengths.

A further embodiment is a structure comprising a substrate and a charge-less dielectric. The substrate comprises a photo diode. The charge-less dielectric layer is on a first side of the substrate, and a total charge of the charge-less dielectric results in an average voltage drop of less than 0.2 V across the charge-less dielectric layer.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   forming a dielectric layer on a first side of an image sensor substrate, the image sensor substrate comprising a photo diode;
   bonding the first side of the image sensor substrate to a carrier substrate, the dielectric layer being disposed between the image sensor substrate and the carrier substrate; and
   after the bonding, exposing the dielectric layer to broad spectrum ultraviolet (UV) radiation, wherein no photoresist is over the dielectric layer during the exposing the dielectric layer to the broad spectrum UV radiation.

2. The method of claim 1, wherein the exposing the dielectric layer to the broad spectrum UV radiation includes exposing the dielectric layer to the broad spectrum UV radiation between 3 minutes and 5 minutes.

3. The method of claim 1, wherein the broad spectrum UV radiation includes radiation with wavelengths between 200 nm and 250 nm.

4. The method of claim 1, wherein a plurality of dielectric layers are between the dielectric layer and the image sensor substrate, the plurality of dielectric layers also being exposed by the broad spectrum UV radiation during the exposing the dielectric layer to the broad spectrum UV radiation.

5. The method of claim 1, wherein the dielectric layer is an inter-layer dielectric or an inter-metal dielectric.

6. The method of claim 1 further comprising forming a color filter on the dielectric layer.

7. The method of claim 1 further comprising forming a color filter and a lens on a second side of the image sensor substrate, the second side being opposite the first side.

8. A method comprising:
   forming a photo diode in a substrate;
   depositing a dielectric structure on a first side of the substrate;
   bonding the first side of the substrate to a carrier substrate, the dielectric structure being disposed between the substrate and the carrier substrate; and
   after the bonding, exposing the dielectric structure to broad spectrum ultraviolet (UV) radiation, the broad spectrum UV radiation having UV radiation with a plurality of wavelengths.

9. The method of claim 8, wherein the broad spectrum UV radiation has wavelengths ranging from 200 nm to 250 nm.

10. The method of claim 8, wherein the exposing the dielectric structure to broad spectrum UV radiation lasts between 3 minutes and 5 minutes.

11. The method of claim 8, wherein the dielectric structure is a single dielectric layer.

12. The method of claim 8, wherein the dielectric structure comprises a plurality of dielectric layers.

13. The method of claim 8, wherein no photoresist is on the dielectric structure during the exposing the dielectric structure to the broad spectrum UV radiation.

14. The method of claim 8 further comprising forming a color filter and a lens on the first side of the substrate.

15. The method of claim 8 further comprising forming a color filter and a lens on a second side of the substrate, the second side being opposite from the first side.

16. A method comprising:
   forming a photo device in a semiconductor substrate;
   depositing a dielectric material on a first side of the semiconductor substrate;
   bonding the first side of the semiconductor substrate to a carrier substrate, the dielectric material being disposed between the semiconductor substrate and the carrier substrate; and
   reducing an accumulated charge accumulated on the dielectric material, the reducing comprising, after the bonding, exposing the dielectric material to broad spectrum ultraviolet (UV) radiation, the broad spectrum UV radiation having UV radiation with a plurality of wavelengths, wherein after the reducing, the accumulated charge is less than 0.2 V.

17. The method of claim 16, wherein the exposing the dielectric material to the broad spectrum UV radiation includes exposing the dielectric material to the broad spectrum UV radiation between 3 minutes and 5 minutes.

18. The method of claim 16, wherein the broad spectrum UV radiation includes radiation with wavelengths between 200 nm and 250 nm.

19. The method of claim 16 further comprising forming a color filter and a lens on a second side of the semiconductor substrate, the second side of the semiconductor substrate being opposite from the first side of the semiconductor substrate.

* * * * *